(12) United States Patent
Park et al.

(10) Patent No.: US 7,763,961 B2
(45) Date of Patent: Jul. 27, 2010

(54) HYBRID STACKING PACKAGE SYSTEM

(75) Inventors: Seung Wook Park, Seoul (KR); Jong Wook Ju, Bubaleub Icheon (KR)

(73) Assignee: STATS ChipPAC Ltd., Singapore (SG)

( * ) Notice: Subject to any disclaimer, the term of this patent is extended or adjusted under 35 U.S.C. 154(b) by 83 days.

(21) Appl. No.: 11/278,420

(22) Filed: Apr. 1, 2006

(65) Prior Publication Data
US 2007/0235879 A1    Oct. 11, 2007

(51) Int. Cl.
*H01L 23/02* (2006.01)
(52) U.S. Cl. .............................. 257/678; 257/E23.001
(58) Field of Classification Search ........... 257/E21.137
See application file for complete search history.

(56) References Cited

U.S. PATENT DOCUMENTS

| 5,898,220 A * | 4/1999 | Ball .......................... 257/723 |
| 6,300,163 B1 * | 10/2001 | Akram ........................ 438/108 |
| 6,744,137 B2 | 6/2004 | Kinsman |
| 6,825,550 B2 | 11/2004 | Akram |
| 6,917,107 B2 | 7/2005 | Akram |
| 6,995,041 B2 | 2/2006 | Connell et al. |
| 2002/0047196 A1 * | 4/2002 | Yang .......................... 257/723 |
| 2002/0149097 A1 * | 10/2002 | Lee et al. ..................... 257/686 |
| 2003/0013969 A1 * | 1/2003 | Erikson et al. .............. 600/459 |
| 2003/0106711 A1 * | 6/2003 | Rumsey et al. .............. 174/261 |
| 2005/0221533 A1 | 10/2005 | Akram |
| 2006/0189033 A1 * | 8/2006 | Kim ........................... 438/109 |
| 2006/0290005 A1 * | 12/2006 | Thomas et al. .............. 257/777 |

* cited by examiner

*Primary Examiner*—Kimberly D Nguyen
*Assistant Examiner*—Tony Tran
(74) *Attorney, Agent, or Firm*—Mikio Ishimaru

(57) ABSTRACT

A hybrid stacking package system is provided including providing a board-on-chip substrate, having an opening, attaching a first integrated circuit on the board-on-chip substrate, attaching bond wires, between the first integrated circuit and the board-on-chip substrate, through the opening, and mounting a second integrated circuit over the bond wires.

8 Claims, 3 Drawing Sheets

HYBRID STACKING PACKAGE SYSTEM

TECHNICAL FIELD

The present invention relates generally to integrated circuit package systems, and more particularly to a system for board-on-chip package configuration.

BACKGROUND ART

A board-on-chip (BoC) is a semiconductor integrated circuit (IC) device where the die and the circuit board are attached and encapsulated as one package. The die and board are typically attached, prior to encapsulation, by double sided adhesive tape applied to the bottom of the board and top of the die. The die is also electrically connected to the board by bond wires. The then attached die and board are completely encapsulated (packaged) for protection with a compound, such as plastic. The compound is injected into a mold and onto the die and board at a high pressure in a hot molten liquid form. The compound then cools and hardens to form a protective package.

The encapsulation process is complex because a desired exterior surface of the board, containing the ball grid arrays (BGA), must only be partially sealed with the compound used for encapsulation. In particular, the bond wires on the exterior surface of the board must be sealed with the encapsulating compound but the compound cannot contact the ball grid arrays. If the compound contacts the balls of a ball grid array the device will be damaged because the connectivity of the board to external circuits will be negatively impacted.

In a conventional BoC package, the board is physically attached to the die by two pieces of double sided adhesive tape, placed in between the die and board. The die is electrically connected to the board by bond wires which pass through a bond wire slot in board. The bond wires are all physically located between the two pieces of adhesive tape, in the bond wire slot.

During encapsulation the compound must fill the bond wire slot and cover all bond wires on the board, but the compound must not flow beyond the edges of the ball grid arrays. The molding compound is introduced into the BoC package under high pressure at a mold gate. The molding compound then begins to fill a mold containing the die and encapsulates the BoC package. In this conventional BoC package the bond wire slot may fill before the molding compound has completely encapsulated the entire die. Thus, the compound may begin to flow up and over the top of the board and past the edges of the ball grid arrays, before the die is encapsulated. As described above, when the molding compound contacts the ball grid arrays, the BoC package may be damaged.

The foregoing problems of encapsulation of a BoC package are undesirable aspects of conventional semiconductor packaging techniques. A system and method are needed to better encapsulate a BoC package such that the ball grid array will not be damaged during encapsulation.

Thus, a need still remains for method of manufacturing that will yield reliable and easy to assemble BoC package. In view of the ever increasing demand for very small and functionally complicated electronic devices, it is increasingly critical that answers be found to these problems. In view of the need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a hybrid stacking package system comprising providing a board-on-chip substrate, having an opening, attaching a first integrated circuit on the board-on-chip substrate, attaching bond wires, between the first integrated circuit and the board-on-chip substrate, through the opening, and mounting a second integrated circuit over the bond wires.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
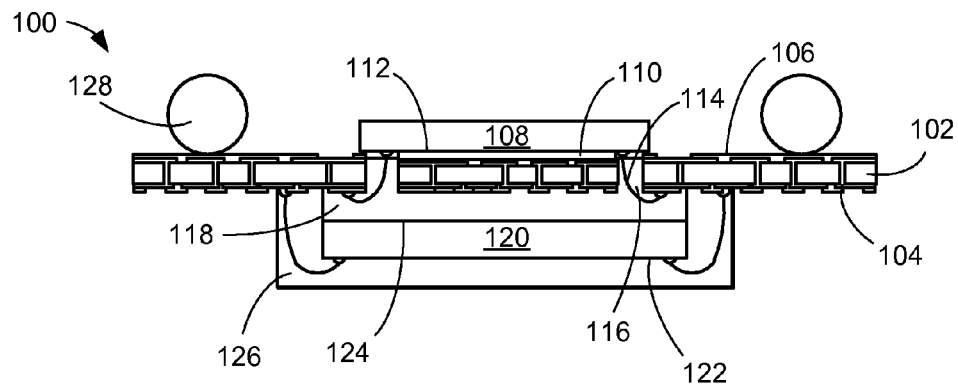
FIG. 1 is a cross-sectional view of a hybrid stacking package system, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the device are semi-diagrammatic and not to scale and, particularly, some of the dimensions are for the clarity of presentation and are shown greatly exaggerated in the drawing FIGS. The same numbers are used in all the drawing FIGS. to relate to the same elements. The term "horizontal" as used herein is defined as a plane parallel to the conventional plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure.

Referring now to FIG. 1, therein is shown cross-sectional view of a hybrid stacking package system 100, in an embodiment of the present invention. The cross-sectional view of the hybrid stacking package system 100 includes a board-on-chip substrate 102, having a top side 104 and a bottom side 106. The board-on-chip substrate 102 preferably includes a base material having two or more substantially horizontal layers, laminates, or tiers such as the top side 104 or the bottom side 106 integral with substantially horizontal traces interconnected with substantially vertical connectors. A first integrated circuit 108 is mounted, to the bottom side 106, by a die attach film 110 on a first active side 112. The first integrated circuit 108 is electrically connected to the top side 104 of the board-on-chip substrate 102 by bond wires 114 that pass through an opening 116 in the board-on-chip substrate 102.

A die attach material 118, such as a die attach epoxy, fills the opening 116 and coats the top side 104 of the board-on-chip substrate 102. A second integrated circuit 120 is mounted with the die attach material 118 on a second back side 124, so that a second active side 122 is facing away from the board-on-chip substrate 102. The second integrated circuit 120 is electrically connected, to the top side 104 of the board-on-chip substrate 102, by the bond wires 114. A molding compound 126 encapsulates the second integrated circuit 120, the bond wires 114 and a portion of the top side 104 of the board-on-chip substrate 102. Electrical interconnects 128, such as solder balls, solder columns, or stud bumps, are attached to the bottom side 106 of the board-on-chip substrate 102 for connection to the next level system (not shown).

Figure 2:
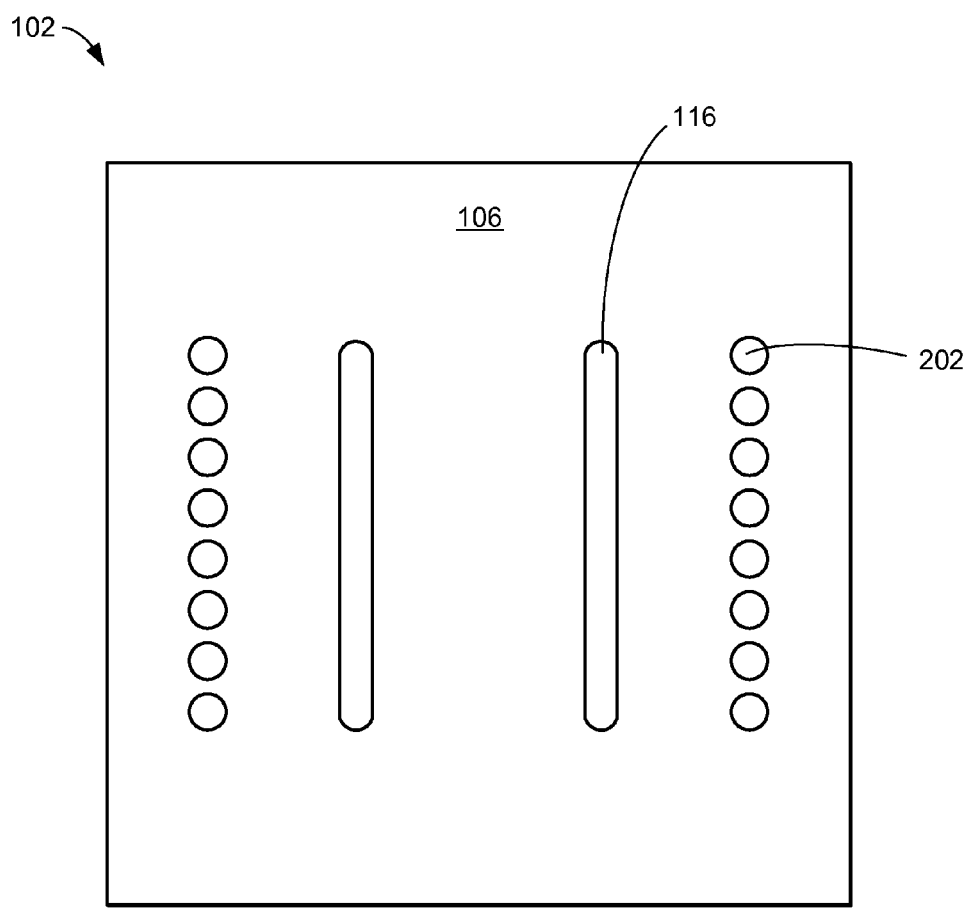
FIG. 2 is a bottom side view of the board-on-chip substrate, as shown in FIG. 1.

Referring now to FIG. 2, therein is shown a bottom view of the board-on-chip substrate 102, as shown in FIG. 1. The bottom view of the board-on-chip substrate 102 includes the bottom side 106 of the board-on-chip substrate 102, the opening 116, and interconnect pads 202. The board-on-chip substrate 102 is a near chip scale packaging component. The first integrated circuit 108, of FIG. 1, is laminated to the board-on-chip substrate 102 in a two step process. First the first integrated circuit 108 is positioned on the board-on-chip substrate 102. This step requires a high degree of accuracy in positioning the first integrated circuit 108 so that the bonding pads (not shown) are aligned with the opening 116. In the second step, the first integrated circuit 108 is subjected to heat and pressure for a fixed period of time in order to cure the die attach material and laminate the first integrated circuit to the board-on-chip substrate 102. In order to maintain the production flow, multiple units are laminated concurrently.

Figure 3:
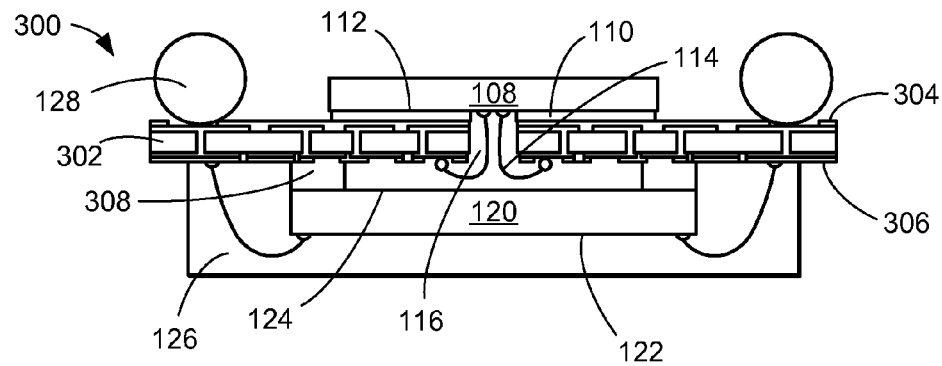
FIG. 3 is a cross-sectional view of the hybrid stacking package system, in an alternative embodiment of the present invention.

Referring now to FIG. 3, therein is shown a cross-sectional view of a hybrid stacking package system 300, in an alternative embodiment of the present invention. The cross-sectional view of the hybrid stacking package system 300 includes a laminate board-on-chip substrate 302, the first integrated circuit 108 attached to the laminate board-on-chip substrate 302 by the die attach film 110 and electrically connected by the bond wires 114. The first active side 112, of the first integrated circuit 108, is adhered to a bottom side 304, of the laminate board-on-chip substrate 302. The bond wires 114 pass through the opening 116 located in the center of the laminate board-on-chip substrate 302 and are electrically connected to a top side 306 of the laminate board-on-chip substrate 302. The die attach material 118 fills the opening 116 and covers the bond wires 114.

The second integrated circuit 120 is mounted on the die attach material 118 so that the second active side 122 is facing away from the laminate board-on-chip substrate 302. An under-fill material 308, such as a die attach epoxy, is applied between the top side 306, of the laminate board-on-chip substrate 302, and the second back side 124 of the second integrated circuit 120. The second integrated circuit 120 is electrically connected, to the top side 306 of the laminate board-on-chip substrate 302, by the bond wires 114. The molding compound 126 encapsulates the second integrated circuit 120, the bond wires 114 and a portion of the top side 306 of the laminate board-on-chip substrate 302. The electrical interconnects 128, such as solder balls, solder columns, or stud bumps, are attached to the bottom side 304 of the laminate board-on-chip substrate 302 for connection to the next level system (not shown).

Figure 4:
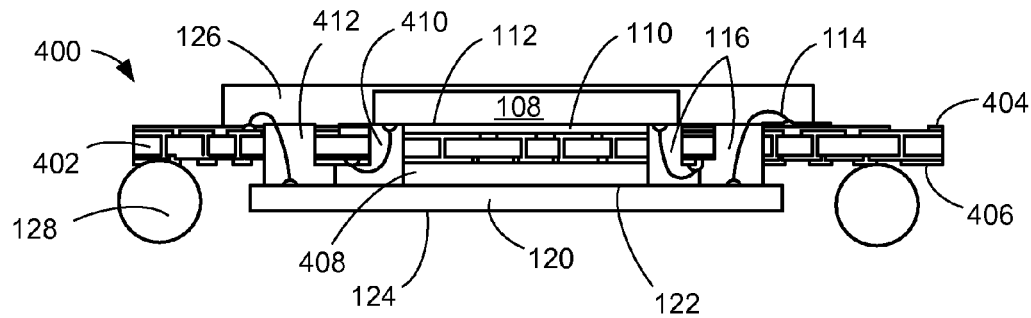
FIG. 4 is a cross-sectional view of the hybrid stacking package system, in another alternative embodiment of the present invention.

Referring now to FIG. 4, therein is shown a cross-sectional view of a hybrid stacking package system 400, in another alternative embodiment of the present invention. The cross-sectional view of the hybrid stacking package system 400 depicts a board-on-chip substrate 402, having a top side 404 and a bottom side 406, the first integrated circuit 108 attached to the board-on-chip substrate 402 by the die attach film 110 and electrically connected by the bond wires 114. The first active side 112, of the first integrated circuit 108, is adhered to the bottom side 406, of the board-on-chip substrate 402. The bond wires 114 pass through a first set of the opening 116 and electrically connect the first active side 112 of the first integrated circuit 108 to the bottom side 406 of the board-on-chip substrate 402.

An IC spacer 408 is attached between the second active side 122 of the second integrated circuit 120 and the bottom side 406 of the board-on-chip substrate 402. A first die attach material 410, such as a die attach epoxy, is used to fill the first set of the opening 116. The second integrated circuit 120 is electrically connected, to the top side 404 of the board-on-chip substrate 402, by the bond wires 114 through a second set of the openings 116. A second die attach material 412, such as die attach epoxy, is used to fill the second set of the opening 116 that aligns with the outer edge of the second integrated circuit 120. The molding compound 126 encapsulates the first integrated circuit 108, the bond wires 114 and a portion of the board-on-chip substrate 402. The electrical interconnects 128, such as solder balls, solder columns, or stud bumps, are attached to the bottom side 406 of the board-on-chip substrate 402 for connection to the next level system (not shown).

Figure 5:
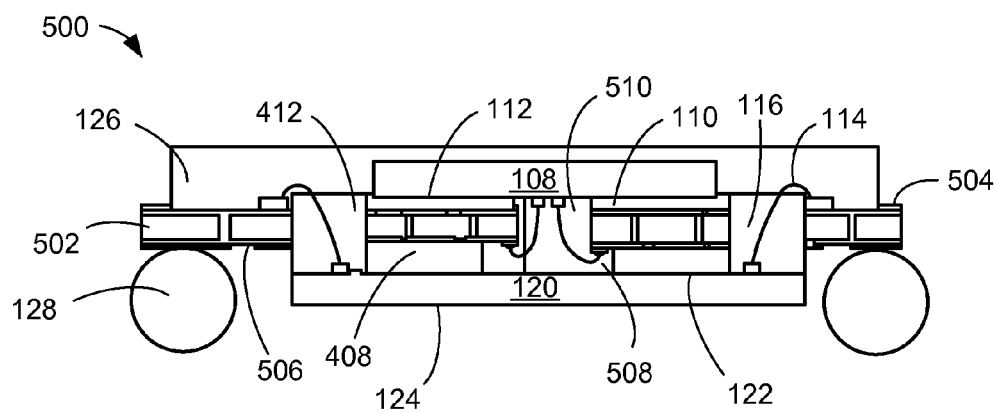
FIG. 5 is a cross-sectional view of the hybrid stacking package system, in yet another alternative embodiment of the present invention.

Referring now to FIG. 5, therein is shown a cross-sectional view of a hybrid stacking package system 500, in yet another alternative embodiment of the present invention. The cross-sectional view of the hybrid stacking package system 500 depicts a board-on-chip substrate 502, having a top side 504 and a bottom side 506, the first integrated circuit 108 attached to the board-on-chip substrate 502 by the die attach film 110 and electrically connected by the bond wires 114. The first active side 112, of the first integrated circuit 108, is adhered to the bottom side 506, of the board-on-chip substrate 502. The bond wires 114 pass through a first set of the opening 116 and electrically connect the first active side 112 of the first integrated circuit 108 to the bottom side 506 of the board-on-chip substrate 502.

The IC spacer 408 is attached to the bottom side 506 of the board-on-chip substrate 502. A first die attach material 508, such as a die attach epoxy, is used to fill a first opening 510. The second integrated circuit 120 is mounted on the IC spacer 408 and the surface of the first die attach material 508 and is electrically connected, to the top side 504 of the board-on-chip substrate 502, by the bond wires 114. The second die attach material 412, such as die attach epoxy, is used to fill the second set of the opening 116 that aligns with the outer edge of the second integrated circuit 120. The molding compound 126 encapsulates the first integrated circuit 108, the bond wires 114 and a portion of the board-on-chip substrate 502. The electrical interconnects 128, such as solder balls, solder columns, or stud bumps, are attached to the bottom side 506 of the board-on-chip substrate 502 for connection to the next level system (not shown).

Figure 6:
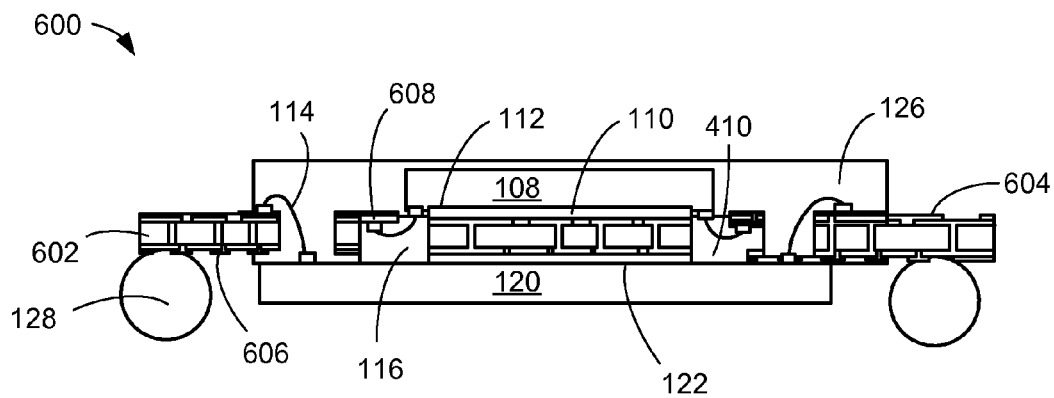
FIG. 6 is a cross-sectional view of the hybrid stacking package system, in still another alternative embodiment of the present invention.

Referring now to FIG. 6, therein is shown a cross-sectional view of a hybrid stacking package system 600, in still another alternative embodiment of the present invention. The cross-sectional view of the hybrid stacking package system 600 depicts a multi-tier board-on-chip substrate 602, having a top side 604 and a bottom side 606, the first integrated circuit 108 attached to the multi-tier board-on-chip substrate 602 by the die attach film 110 and electrically connected by the bond wires 114. The first active side 112, of the first integrated circuit 108, is adhered to the top side 604, of the multi-tier board-on-chip substrate 602. The bond wires 114 pass through a first set of the opening 116 and electrically connect the first active side 112 of the first integrated circuit 108 to a first tier 608 of the multi-tier board-on-chip substrate 602.

The die attach film 110 is attached between the second active side 122 of the second integrated circuit 120 and the bottom side 606 of the multi-tier board-on-chip substrate 602. The first die attach material 410, such as a die attach epoxy, is used to fill the first set of the opening 116 and encapsulates the bond wires 114 that electrically connect the first integrated circuit 108 to the first tier 608 of the multi-tier board-on-chip substrate 602.

The second integrated circuit 120 is mounted on the die attach film 110 and the surface of the first die attach material 410 and is electrically connected, to the top side 604 of the multi-tier board-on-chip substrate 602, by the bond wires 114. The molding compound 126 encapsulates the first integrated circuit 108, the bond wires 114 and a portion of the multi-tier board-on-chip substrate 602. The electrical interconnects 128, such as solder balls, solder columns, or stud bumps, are attached to the bottom side 606 of the multi-tier board-on-chip substrate 602 for connection to the next level system (not shown).

Figure 7:
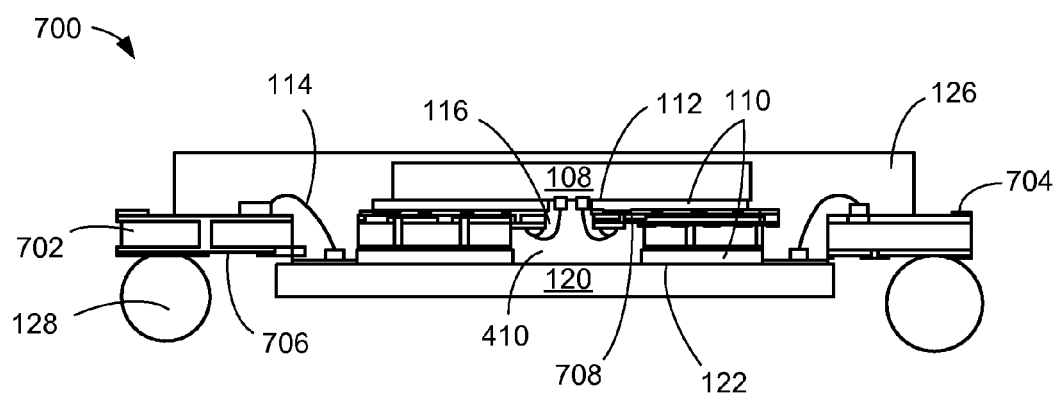
FIG. 7 is a cross-sectional view of the hybrid stacking package system, in still yet another alternative embodiment of the present invention.

Referring now to FIG. 7, therein is shown a cross-sectional view of a hybrid stacking package system 700, in still yet another alternative embodiment of the present invention. The cross-sectional view of the hybrid stacking package system 700 depicts a multi-tier board-on-chip substrate 702, having a top side 704 and a bottom side 706, the first integrated circuit 108 attached to the multi-tier board-on-chip substrate 702 by the die attach film 110 and electrically connected by the bond wires 114. The first active side 112, of the first integrated circuit 108, is adhered to the top side 704, of the multi-tier board-on-chip substrate 702. The bond wires 114 pass through the opening 116 and electrically connect the first active side 112 of the first integrated circuit 108 to a first tier 708 of the multi-tier board-on-chip substrate 702.

The die attach film 110 is attached between the second active side 122 of the second integrated circuit 120 and the bottom side 706 of the multi-tier board-on-chip substrate 702. The first die attach material 410, such as a die attach epoxy, is used to fill the opening 116 and encapsulates the bond wires 114 that electrically connect the first integrated circuit 108 to the first tier 708 of the multi-tier board-on-chip substrate 702.

The second integrated circuit 120 is mounted on the die attach film 110 and the surface of the first die attach material 410 and is electrically connected, to the top side 704 of the multi-tier board-on-chip substrate 702, by the bond wires 114. The molding compound 126 encapsulates the first integrated circuit 108, the bond wires 114 and a portion of the multi-tier board-on-chip substrate 602. The electrical interconnects 128, such as solder balls, solder columns, or stud bumps, are attached to the bottom side 706 of the multi-tier board-on-chip substrate 702 for connection to the next level system (not shown).

Figure 8:
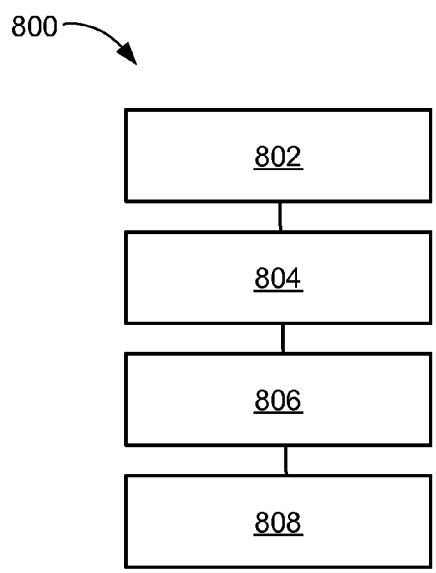
FIG. 8 is a flow chart of a hybrid stacking package system for the manufacturing of a hybrid stacking package system, in accordance with an embodiment of the present invention.

Referring now to FIG. 8, therein is shown a flow chart of a hybrid stacking package system for the manufacturing of a hybrid stacking package system, in accordance with an embodiment of the present invention. The system 800 includes providing a board-on-chip substrate, having an opening in a block 802; attaching a first integrated circuit on the board-on-chip substrate in a block 804; attaching bond wires, between the first integrated circuit and the board-on-chip substrate, through the opening in a block 806; and mounting a second integrated circuit over the bond wires in a block 808.

In greater detail, a method to manufacture a hybrid stacking package system, in an embodiment of the present invention, is performed as follows:
1. Providing a board-on-chip substrate, having an opening. (FIG. 1)
2. Attaching a first integrated circuit on the board-on-chip substrate includes applying a die attach film on the board-on-chip substrate beneath the first integrated circuit. (FIG. 1)
3. Attaching bond wires, between the first integrated circuit and the board-on-chip substrate, through the opening includes forming an electrical connection on the surface of the board-on-chip substrate opposite the first integrated circuit. (FIG. 1) and
4. Mounting a second integrated circuit over the bond wires includes mounting an IC spacer between the second integrated circuit and the board-on-chip substrate. (FIG. 1)

It has been discovered that hybrid stacking package system produces a reliable and very small multi-chip device. The near chip scale package can maintain the small size because the distance needed to allow wire sweep for the bond wires is reduced by the attachment of the bond wires to the opposite side of the board-on-chip substrate. By using die attach material to encapsulate the bond wire connections the bond wires are held in place and the mounting of a second integrated circuit assures the bond wires will not be stressed or moved.

It has been discovered that the present invention thus has numerous aspects.

An aspect is that the present invention the near chip scale dimensions of the hybrid stacking package system allows multiple integrated circuit functions to reside in the smallest possible space.

Another aspect is the use of die attach epoxy asserts less stress on the bond wire connections during the assembly process. This helps the bond wire connections stay firmly attached and reduces wire movement and stress fractures.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the hybrid stacking package system method and apparatus of the present invention furnish important and heretofore unknown and unavailable solutions, capabilities, and functional aspects for near chip scale package assembly. The resulting processes and configurations are straightforward, cost-effective, uncomplicated, highly versatile and effective, can be implemented by adapting known technologies, and are thus readily suited for efficiently and economically manufacturing multi function near chip scale devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A hybrid stacking package system comprising:
providing a board-on-chip substrate, having an opening;
attaching a first integrated circuit on the board-on-chip substrate includes applying a die attach film on the board-on-chip substrate beneath the first integrated circuit;
attaching bond wires, between the first integrated circuit and the board-on-chip substrate, through the opening includes forming an electrical connection on the surface of the board-on-chip substrate opposite the first integrated circuit;
mounting a second integrated circuit over the bond wires includes mounting an IC spacer between the second integrated circuit and the board-on-chip substrate; and
attaching bond wires between the second integrated circuit and the board-on-chip substrate through a second set of openings.

2. The system as claimed in claim 1 further comprising including a die attach material, on the bond wires, filling the opening includes forming a mounting surface for an integrated circuit.

3. The system as claimed in claim 1 further comprising applying amolding compound for encapsulating the integrated circuit and the bond wires provides protecting the bond wires.

4. The system as claimed in claim 1 further comprising attaching electrical interconnects on the board-on-chip substrate for system connection, wherein attaching the electrical interconnects includes attaching solder balls, solder bumps, stud bumps or a combination thereof.

5. A hybrid stacking package system comprising:
a board-on-chip substrate, having an opening;
a first integrated circuit attached on the board-on-chip substrate;
bond wires attached, between the first integrated circuit and the board-on-chip substrate, through the opening;
a second integrated circuit mounted over the bond wires;
bond wires attached between the second integrated circuit and the board-on-chip substrate through a second set of openings;
a die attach film on the board-on-chip substrate beneath the first integrated circuit;
an electrical connection formed on the surface of the board-on-chip substrate opposite the first integrated circuit; and
an IC spacer mounted between the second integrated circuit and the board-on-chip substrate.

6. The system as claimed in claim 5 further comprising a die attach material, on the bond wires, to fill the opening includes a mounting surface formed for an integrated circuit.

7. The system as claimed in claim 5 further comprising a molding compound for encapsulating the integrated circuit and the bond wires provides protection for the bond wires.

8. The system as claimed in claim 5 further comprising electrical interconnects attached on the board-on-chip substrate for system connection, wherein the electrical interconnects include solder balls, solder bumps, stud bumps or a combination thereof.

* * * * *

UNITED STATES PATENT AND TRADEMARK OFFICE
CERTIFICATE OF CORRECTION

PATENT NO. : 7,763,961 B2
APPLICATION NO. : 11/278420
DATED : July 27, 2010
INVENTOR(S) : Park et al.

It is certified that error appears in the above-identified patent and that said Letters Patent is hereby corrected as shown below:

Column 8:

Claim 3, line 2, delete "amolding" and insert therefor --a molding--

Signed and Sealed this

Sixteenth Day of November, 2010

David J. Kappos
*Director of the United States Patent and Trademark Office*